United States Patent [19]

Sinclair

[11] Patent Number: 5,057,031
[45] Date of Patent: Oct. 15, 1991

[54] ZERO INSERTION FORCE PIN GRID ARRAY TEST SOCKET

[75] Inventor: William Y. Sinclair, Frenchtown, N.J.

[73] Assignee: Aries Electronics, Inc., N.J.

[21] Appl. No.: 567,620

[22] Filed: Aug. 15, 1990

[51] Int. Cl.⁵ .......................................... H01R 13/629
[52] U.S. Cl. ..................................... 439/261; 439/259
[58] Field of Search ......... 439/259, 342, 264, 260-265

[56] References Cited

U.S. PATENT DOCUMENTS

| | | | |
|---|---|---|---|
| 3,676,832 | 7/1972 | Judge et al. | 439/342 |
| 3,763,459 | 10/1973 | Millis | 439/264 |
| 3,915,537 | 10/1975 | Harris et al. | 439/342 |
| 4,426,122 | 1/1984 | Lainez et al. | 439/331 |
| 4,468,076 | 8/1984 | Hine et al. | 439/264 |
| 4,498,725 | 2/1985 | Bright et al. | 439/342 |
| 4,648,669 | 3/1987 | Marks et al. | 439/342 |
| 4,669,797 | 6/1987 | Bourdon | 439/353 |
| 4,744,768 | 5/1988 | Rios | 439/264 |
| 4,750,891 | 6/1988 | Egawa | 439/342 |

Primary Examiner—Larry I. Schwartz
Assistant Examiner—Kevin J. Carroll
Attorney, Agent, or Firm—Anthony J. Casella; Gerald E. Hespos

[57] ABSTRACT

The invention disclosed herein relates to a test socket for making solderless connections between an electrical component and a printed circuit board. The socket includes a lid member that translates longitudinally with respect to a base member upon operating a cammed actuator. The lid member is connected to and guided upon the base member by a plurality of flexible linking clips. The invention includes a plurality of electrical connectors having a pair of resilient beams that are preloaded. A lead portion is formed from one of the opposed beams and extends unitarily therefrom.

9 Claims, 4 Drawing Sheets

ZERO INSERTION FORCE PIN GRID ARRAY TEST SOCKET

BACKGROUND OF THE INVENTION

The subject invention relates to a new and improved zero insertion force pin grid array socket for temporarily connecting the conductive pins of an electrical component and a printed circuit board during a test and evaluation procedure. Further, the subject invention relates to a new and improved electrical connector having preloaded contact beams.

To determine whether or not an electrical component, such as an integrated circuit pack, will perform reliably it is necessary to test and evaluate each device on a printed circuit board. In the past testing involved forcing leads on a device into a receptacle having spring loaded contacts which were connectible to circuitry. This type of connection required the exertion of considerable pressure.

The necessity for the exertion of considerable pressure to urge the leads into the contacts was undesirable. In applications that involved components with a substantial number of leads it became exceedingly difficult to force the leads into a connector. Further, the exertion of substantial pressure upon the leads of the component into the spring loaded contacts often resulted in breaking or bending the leads.

Accordingly, in the prior art various improved connectors have been developed which are designed to reduce or eliminate the insertion force required to urge the leads of an electrical component into the connector. An example of a low insertion force socket is disclosed in U.S. Pat. No. 3,763,459 which issued to Millis on Oct. 2 1973 entitled "Plug in Type Socket For Testing Semiconductors". The socket disclosed in U.S. Pat. No. 3,763,459 comprises a generally rectangular upper section and a generally rectangular lower section with a generally rectangular longitudinally movable center section therebetween. The upper section includes a plurality of openings for receiving the pins of an integrated circuit pack. The lower section includes a corresponding plurality of electrical contacts, each having a pair of resilient contact beams and a solder tail. The resilient contact beams of the electrical contacts extend through the center section so that they are each aligned within a respective channel. The solder tail of each of the electrical contacts extends through the exposed surface of the lower portion so as to connect with a printed circuit board.

The socket disclosed in U.S. Pat. No. 3,763,459, is operated by inserting the conductive pins of an integrated circuit pack into the receptacle openings in the upper member such that they extend into the center section of the socket. Thereafter, a cranked actuator is rotated to cause the center section of the socket to slide longitudinally, relative to the upper and lower members. Simultaneously, the walls of the channels disposed within the center section exert a biasing force on the arms of the contacts such that they make electrical connection with the conductive pins of the integrated circuit pack. Upon completion of a test the crank can be oppositely rotated to permit the center portion to slide back to its normal unlocked position whereby the resilient contact arms return to their relaxed condition.

Another form of low insertion force test socket is disclosed in U.S. Pat. No. 4,648,669 which issued to Marks et al., on Mar. 10, 1987 entitled "Removable Retaining And Guide Means For Electrical Sockets". The latter discloses an electrical socket comprising a generally rectangular non-conductive plastic base member with a generally rectangular non-conductive plastic upper member slidably movable thereupon. The upper member of the socket includes a plurality of pin receiving apertures disposed in a grid array. The base member includes a plurality of electrical connectors which are disclosed in U.S. Pat. No. 4,498,725 which issued to Bright et al., on Feb. 12, 1985 entitled "Electrical Connector". The connector depicted in U.S. Pat. No. 4,498,725 includes a pair of generally 7-shaped resilient contact beams and a solder tail extending outwardly from one of the beams. The plurality of electrical connectors are disposed within a plurality of corresponding walled cavities defined within the base member such that the walls of the cavities supply the resilient contact beams of each of the electrical connectors with an inwardly biased contact force. The socket further includes a generally L-shaped cammed actuator disposed in a journal in the base member.

The upper member and the lower member of the socket disclosed in U.S. Pat. No. 4,648,669 include a plurality of interfingering hole-containing blocks disposed intermediate, and extending outwardly from, the lateral edges of the upper member and base member respectively. The interfingering blocks extend beyond the planar area of the base member and lid member, thus necessarily increasing the envelope of the socket on a circuit board. A plurality of cylindrical rigid retaining and guide pins, having upturned ends, are forcibly inserted, parallel to the plane of the socket, into the holes in the interfingering blocks, thereby connecting the upper member to the base member and guiding it thereon. The rigid retaining and guide pins may be removed in order to replace a broken electrical connector. However, repeated removal of the pins will have a detrimental effect on the plastic socket, thus eventually the socket will have to be discarded. In another embodiment of the socket disclosed in U.S. Pat. No. 4,648,669 the upper member is connected to the base member by a U-shaped rigid retaining member.

Accordingly, it is an object of the subject invention to provide a new and improved zero insertion force pin grid array test socket having a plurality of flexible non-destructive retaining and guide means.

A further object of the subject invention is to provide a flexible retaining and guide means that does not increase the size or envelope of a pin grid array test socket.

A further object of the subject invention is to provide a flexible retaining and guide means for a pin grid array test socket which is inexpensive to manufacture.

A further object of the subject invention is to provide a flexible retaining and guide means for a pin grid array test socket which is disposable.

A further object of the subject invention is to provide a new and improved electrical connector having a pair of neutrally inwardly biased contact beams.

A further object of the subject invention is to provide a new and improved electrical connector that is inexpensive to manufacture.

SUMMARY OF THE INVENTION

Figure 1:
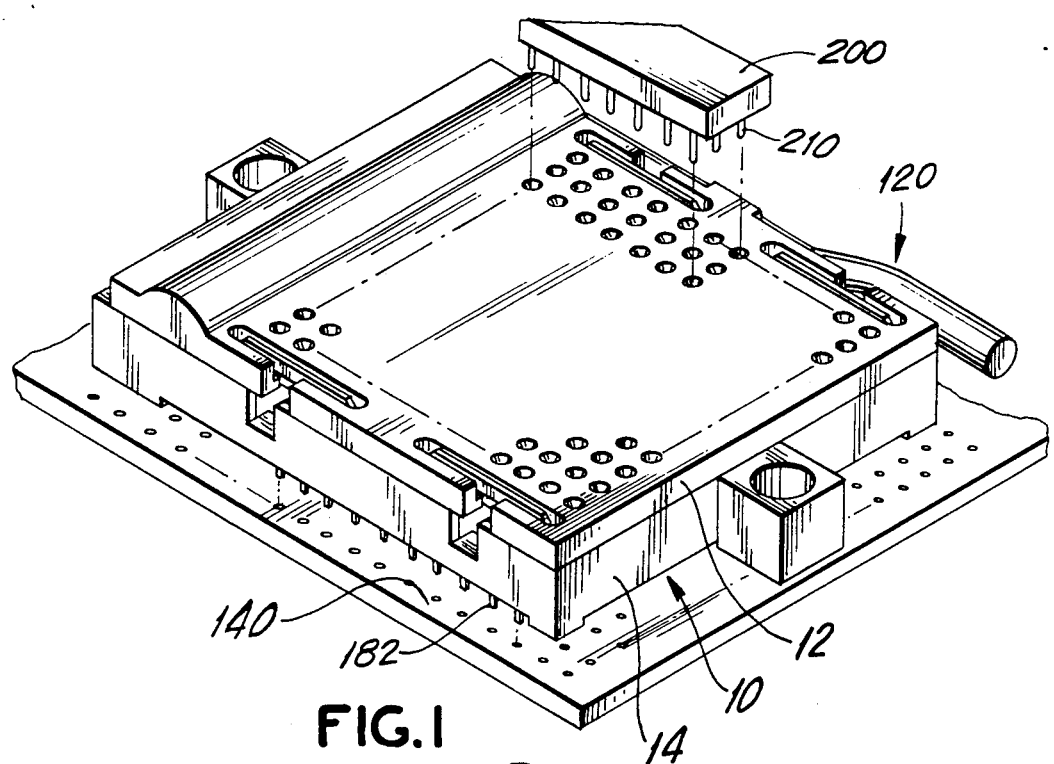
FIG. 1 is a perspective view of the zero insertion force pin grid array test socket of the subject invention in the closed position.

The subject invention provides for a new and improved zero insertion force pin grid array test socket assembly for receiving an integrated circuit pack having a plurality of conductive pins disposed in a grid array. The subject invention further provides for a new and improved electrical connector particularly adapted for use with the subject pin grid array test socket.

The zero insertion force pin grid array test socket basically comprises a nonconductive base member and a nonconductive lid that translates longitudinally along the upper surface of the base member and which is driven by a manually operated cammed actuator. The socket further comprises a plurality of flexible linking clips that connect the lid member to, and guide the lid member on, the base member. The socket further comprises a plurality of electrical connectors having preloaded contact beams which are mounted in and float freely within the base member.

The upper lid of the socket is a generally rectangular member having front and rear ends, and opposed lateral walls. The lid member includes a plurality of generally conical shaped apertures extended therethrough perpendicular to the plane of the socket, and disposed in a grid array, and spaced so as to receive the conductive pins of an integrated circuit pack. The lid member further includes a plurality of generally T-shaped clip receiving apertures extending perpendicular to the plane of the socket, and disposed in a spaced apart relationship in the opposed lateral walls thereof. Each of the T-shaped clip receiving slots comprises an elongated oval recessed clip bridge seat from which a receiving slot depends.

The lid member further includes first and second sets of cam blocks adjacent the rear edge of the lid and extending from the bottom surface thereof so as to receive an applied force from a cammed actuator. Each set of cam blocks comprises a forward forcing block and a rearward forcing block separated by a hemicylindrical channel within which the cam rotates. The lid member further includes a cam stop detent extending outwardly from a lateral edge thereof so as to restrict the handle of the cammed actuator from moving when the socket is engaged.

The lower base of the subject socket is a generally rectangular member having planar dimensions that are similar to those of the lid member, and having front and rear walls and opposed side walls. The base member includes a plurality of elongated channels which correspond to the spaced apart pin receiving apertures in the lid member and which channels are disposed parallel to the opposed side walls thereof. Each of the elongated channels is separated by a plurality of perpendicular subdividing walls to define a plurality of box-like connector receiving ports disposed in a grid array so as to correspond to the spaced apart pin receiving apertures in the lid member. A plurality of circular apertures are disposed respectively within the walls of each of the connector receiving ports extending through the bottom surface of the base member and arranged so as to correspond with the pin receiving apertures in the lid member. The circular apertures, which are provided to receive the leads of an electrical connector, have a diameter slightly larger than the width of the lead of an electrical connector. Thus, the lead of an electrical connector can float freely within a respective circular aperture. The base member further includes a plurality of clip locking slots disposed in spaced apart relationship in the opposed side walls thereof and extended perpendicular to the plane of the socket so as to correspond to the clip receiving slots in the lid member.

A cam journal is disposed adjacent and parallel to the rear edge of the base member for accepting the manually operated cammed actuator of the subject invention. The cam journal comprises an elongated generally hemi-cylindrical channel having an open end extending through one opposed side wall of the base member and a closed end at the other side wall thereof. First and second spaced apart forward forcing block cavities are disposed adjacent to the forward edge of the cam journal so as to accept the forward forcing blocks extending downwardly from the lid member. First and second spaced apart rearward forcing block cavities are disposed adjacent to the rearward edge of the cam journal and are extended through the rear wall of the base member on an alternate plane than the cam journal so as to accept the rearward forcing blocks extending downwardly from the lid member.

The base member further includes a cavity extended into the center of the rear wall of the base member, perpendicular to the plane of the socket. A coiled spring is disposed within the cavity, and a plunger is disposed in the cavity and exerts an upwardly applied force upon the unexposed surface of the lid member. A gusset flange extends outwardly from the rear edge of the first opposed side wall on the same plane as the lower surface of the base member to aid in the operation of the cammed actuator. A cam rest extends outwardly from the center of the first opposed side wall in the same plane as the gusset flange. The base member further includes front and rear mounting flanges extending outwardly from the front and rear walls respectively. The mounting flanges are provided with apertures for accepting fasteners such that the base of the socket can be secured to a printed circuit board if required.

The socket of the subject invention further includes a plurality of modified π-shaped flexible linking clips unitarily formed from a metallic alloy in an etching process. The plurality of flexible linking clips are provided to connect the lid member to the base member and to guide the lid member upon the base member during opening and closing operations. The flexible linking clips comprise a pair of parallel spaced apart resilient legs connected at one end by a bridge. Each of the resilient legs includes an outwardly extending engaging foot on the lower distal end thereof respectively. Each flexible linking clip is intended to be inserted into a respective clip receiving slot in the lid member such that its pair of parallel legs extend therethrough and into a respective clip locking slot in the base member, whereby the engaging feet are locked therein so as to connect the lid member and the base member.

The socket of the subject invention further includes a plurality of generally Y-shaped electrical connectors. The electrical connectors are unitarily formed from a metallic alloy in a stamping process. Each electrical connector of the subject invention comprises first and second opposed resilient contact beams connected at their lower ends by a bight. The first and second contact beams include first and second inwardly biased flanged contact arms disposed on the upper distal ends thereof respectively. The flanged contact arm on the first opposed contact beam includes a hemispherical dimple extending inwardly therefrom so as to make contact with the inner surface of the contact arm on the second opposed contact beam. By providing the hemispherical dimple on the first contact arm, the contact beams of the electrical connector are preloaded and therefore neutrally inwardly biased, and thus do not depend upon the walls of the connector receiving ports for contact force. Hence, the electrical connectors of the subject socket float freely within their respective receiving ports in the base member and are held in place by the lid member.

A solder tail is stamped out of the first opposed resilient contact beam and is bent out therefrom so as to extend downward. The solder tail includes an elongated embossment which extends outwardly therefrom along most of its length so as to provide reinforcement. There is a substantial economic gain in forming the solder tail from the body of the connector. In particular, the amount of material required to manufacture the connector is considerably less than the prior art.

The subject pin grid array test socket further includes a generally L-shaped cammed actuator comprising an elongated handle portion, which extends outwardly from a side wall of the base member and a cammed portion, which resides in the cam journal disposed in the base member of the socket. The cammed portion includes first and second spaced apart unitarily formed cams. The first cam is disposed adjacent the distal end of the cam portion, the second cam is disposed adjacent the handle portion of the cammed actuator. The first and second cams have a forward orientation and are intended to exert a longitudinal force upon the cam blocks extending downward from the lid member. A cam stabilizer is disposed between the first and second cams to ensure smooth rotation of the cams within the journal during opening and closing operations.

The socket of the subject invention is assembled by inserting an electrical connector into each of the connector receiving ports such that the solder tail of each connector extends through the circular aperture and beyond the bottom surface of the base member. The cammed actuator is disposed in the cam journal such that the distal end of the cammed portion abuts the second opposed side wall of the base member and the inward end of the cammed portion extends out through the first opposed side wall of the base member such that the handle portion lies on the cam rest parallel to the first opposed side wall. The lid member is attached to the base member by aligning the T-shaped clip receiving slots in the lid with the clip locking slot in the base. Thereafter, a plurality of modified $\pi$-shaped flexible linking clips are respectively inserted into the clip receiving slots in the lid member such that the legs of the plurality of clips extend therethrough and into the clip locking slots in the base member. At that time the outwardly extending engaging feet lock the flexible linking clips within the clip locking slots, thereby connecting the lid member to the base member.

In operation the cammed actuator is actuated such that the first and second cams exert a longitudinal force against the rearward cam blocks thereby causing the lid member to slide longitudinally along the surface of the base member such that the socket is positioned in the open condition. While in the open position the spring loaded plunger exerts an upwardly applied vertical force against the unexposed surface of the lid member. In so doing, the plunger functions to ensure that the cammed actuator handle remains in the upward extended position.

Once the socket is in the open condition, an electrical component such as an integrated circuit pack, having a plurality of conductive pins depending therefrom in a grid array may be readily inserted into the lid member. The conductive pins of such a component extend through the lid member and into the elongated open channels disposed in the base member. Accordingly, there is no resistance or interference experienced by the operator of the socket upon inserting the conductive pins into the socket (i.e. zero insertion force). Thereafter, a low downward force is applied upon the handle of the cammed actuator such that the first and second cams exert a longitudinal force against the forward cam blocks thereby causing the lid member to slide longitudinally along the base member toward the forward wall of the base member. Thereupon, the conductive pins of the integrated circuit pack are forced into the inwardly biased flanged contact arms of the electrical connectors so as to make electrical connection.

Subsequently, the handle portion of the cammed actuators actuated over the cam stop detent extending outwardly from the lid member and finally resides upon the cam rest extending outwardly from the base member, whereby the handle is locked in place. At such a time the integrated circuit pack is restrained in place in the zero insertion force pin grid array test socket for evaluation purposes.

Upon completion of a test, the handle portion of the cammed actuator is again lifted so as to cause the lid member to slide longitudinally rearward, thereby disengaging the conductive pins of the integrated circuit pack from the inwardly biased contact arms of the plurality of electrical connectors. Thereafter, the integrated circuit pack may be readily removed and the socket is prepared to receive another electrical component.

Should the situation arise in which one of the plurality of electrical connectors becomes broken o bent the bridges of the plurality of flexible linking clips can be easily severed with a pair of dikes and the lid can be removed. Thereafter, the inexpensive clips can be replaced without damaging the socket assembly, or requiring destruction of the socket assembly.

DETAILED DESCRIPTION OF THE PREFERRED EMBODIMENT

The zero insertion force pin grid array test socket of the subject invention is illustrated in FIG. 1 and is designated generally by reference numeral 10. The socket 10 is intended to provide solderless electrical interconnection between the conductive pins 210 of an electrical component such as an integrated circuit pack 200 and a printed circuit board 140, during a test and evaluation procedure.

Figure 2:
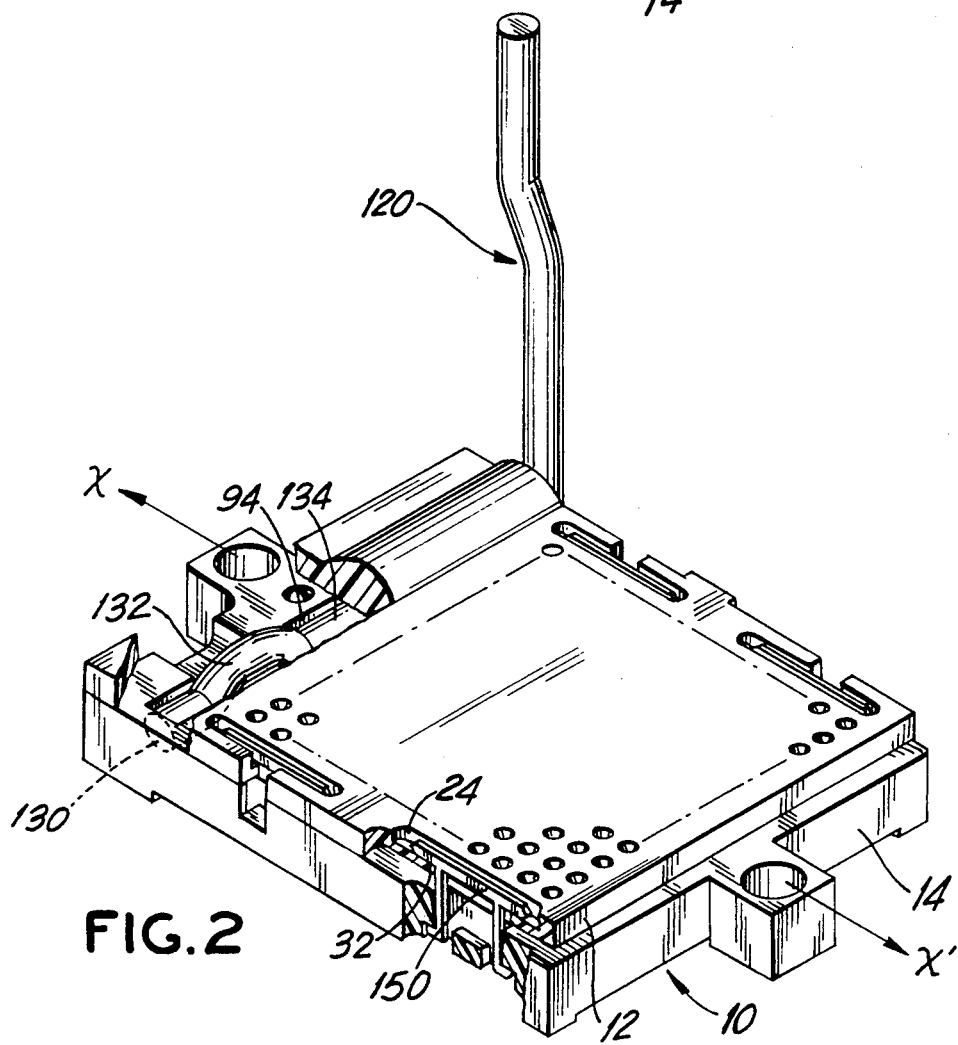
FIG. 2 is a perspective view, partially sectioned, of zero insertion force pin grid array test socket of the subject invention in the open position.
Figure 3:
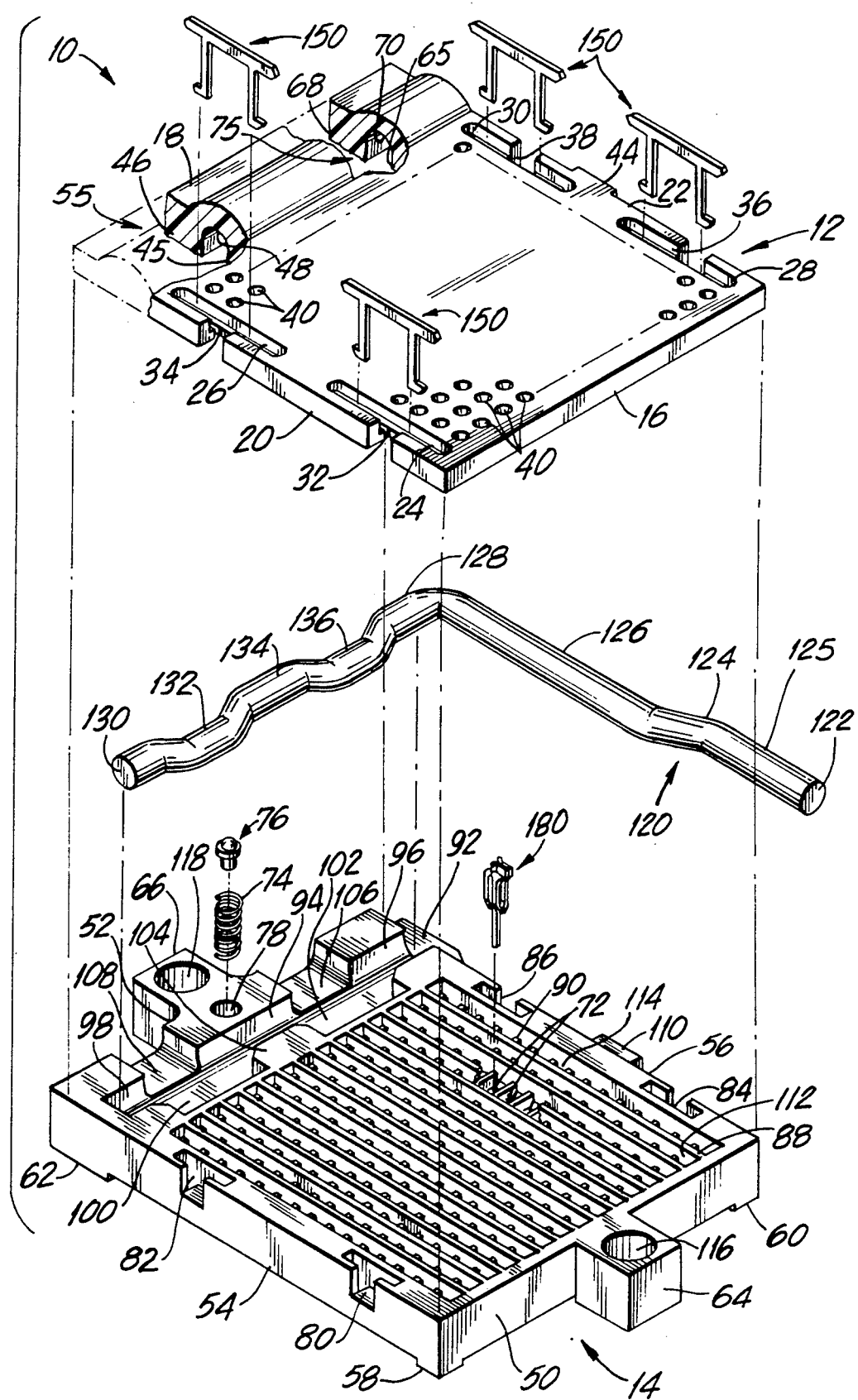
FIG. 3 is an exploded perspective view of the pin grid array test socket of the subject invention.

As illustrated in FIGS. 1 through 3 the socket 10 basically comprises a base member 14 and a lid member 12 that translates longitudinally with respect to the base member 14. A cammed actuator 120 rotates within a cam journal 94 disposed in the base member 14 of the socket 10 and provides the longitudinal force to move the lid member 12 upon the base member 14. A plurality of flexible linking clips 150 connect the lid member 12 to the base member 14 and guide the lid member 12 on the base member 14 during its longitudinal translation. A spring loaded detent plunger 76 is provided to prevent the cammed actuator 120 from moving while in an upright position. A plurality of preloaded electrical connectors 180 are provided to receive the conductive pins 210 of the electrical component 200.

The details of construction of the pin grid array test socket of the subject invention are illustrated in FIG. 3. The lid 12 comprises a generally rectangular member made of a dielectric plastic material which is extremely hard and heat resistant, having a front edge 16, a rear edge 18 and opposed lateral edges 20 and 22.

The lid member 12 includes a plurality of generally conical shaped pin receiving apertures 40 extended therethrough perpendicular to the plane of the socket 10 and disposed in a grid array. The lid member 12 further includes spaced apart T-shaped clip receiving slots 32 and 34 adjacent the lateral edge 20 and extending therethrough perpendicular to the plane of the socket 10, and spaced apart T-shaped clip receiving slots 36 and 38 adjacent the lateral edge 22 and extending therethrough perpendicular to the plane of the socket 10. Each clip receiving slot 32, 34, 36 and 38 is intended to accept a flexible linking clip 150 during assembly of the socket 10. The clip receiving slots 32 and 34 include oval clip bridge seats 24 and 26 respectively. The clip receiving slots 36 and 38 include oval clip bridge seats 28 and 30 respectively which are intended to support the flexible linking clips 150.

The lid member 12 further includes first and second sets of cam blocks 55 and 75 adjacent the rear edge 18 and extending downward from the unexposed surface thereof. The first and second cam block sets 55 and 75 are provided to receive a longitudinally applied force from the cammed actuator 120 upon opening and closing of the socket 10. The first set of cam blocks 55 includes a forward forcing cam block 45 and a rearward forcing cam block 46 separated by a hemi-cylindrical channel 48 extended into the unexposed surface of lid member 12. The second set of cam blocks 75 includes a forward forcing block 65 and a rearward forcing block 68 separated by a hemi-cylindrical channel 70 extended into the unexposed surface of the lid member 12. The lid member 12 also includes a cam stop detent 44 extending outwardly from lateral edge 22 thereof and provided to lock the cammed actuator 120.

The base 14 of the zero insertion force pin grid array test socket 10 comprises a generally rectangular member made from a dielectric plastic material, and having a front wall 50, a rear wall 52 and opposed side walls 54 and 56. The base member 14 includes a plurality of spaced apart elongated dividing walls 88 disposed parallel to the side walls 54 and 56 thereof. The plurality of spaced apart elongated dividing walls 88 define a plurality of parallel elongated channels 112. Each of the elongated channels 112 includes a plurality of spaced apart subdividing walls 90 disposed perpendicular to the elongated dividing walls 88. The plurality of subdividing walls 90 and the corresponding plurality of elongated dividing walls 88 define a plurality of box-like connector receiving ports 114 within each of the parallel elongated channels 112. The plurality of contact receiving ports 114 correspond to the plurality of spaced apart contact receiving apertures disposed in the lid member 12. A plurality of circular aperture 72 are extended through the bottom surface of the base member 14 and correspond to the plurality of contact receiving ports 114.

The base member 14 further includes spaced apart clip locking slots 80 and 82 disposed in the side wall 54 thereof and extended therethrough perpendicular to the plane of the socket 10 and similarly spaced apart locking slots 84 and 86 disposed in the side wall 56 of the base member 14. The clip locking slots 80, 82, 84 and 86 respectively correspond to the clip receiving slots 32, 34, 36 and 38 in the lid member 12. The clip locking slots 80, 82, 84 and 86 are provided to lock the corresponding plurality of flexible linking clips 150 during assembly of the socket 10.

The base member 14 further includes forward stand-offs 58 and 60 and rear stand-offs 62 extending downwardly from the bottom surface thereof. A front mounting flange 64 having mounting hole 116 extending therethrough and a rear mounting flange 68 having mounting hole 118 extending therethrough, extends outwardly from the front wall 50 and rear wall 52 of the base member 14, respectively. The mounting flanges 64 and 68 are provided to secure the base member 14 to the printed circuit board 140 if required. A gusset flange 92 extends outwardly from the rear end of the side wall 56 of the base member 14 which is provided to assist in the operation of the cammed actuator 120. A cam rest 110 is disposed intermediate the side wall 56 and extends outwardly therefrom for the cammed actuator 120.

The socket 10 further includes a generally L-shaped cammed actuator 120 defining an elongated handle portion 126 and a cammed portion 128. The handle portion 126 includes an angled elbow 124 from which an offset portion 125 depends. The offset portion 125 is parallel to the handle portion 126 and allows for convenient manipulation of the cammed actuator 120. The cammed portion 128 of the actuator 120 includes a first cam 136 disposed adjacent to the handle portion 126, a cam stabilizer 134 disposed intermediate the cammed portion 128, and a second cam 132 disposed adjacent the distal 130 thereof. The first cam 136 and the second cam 132 have a forward orientation and are provided to exert a longitudinal force upon the first and second forcing block sets 55 and 75 respectively upon actuation. The cam stabilizer 134 is provided to ensure smooth and even rotation of the cams 132 and 136 of the cammed actuator 120 within the cam journal 94 during actuation.

A hemi-cylindrical cam journal 94 is disposed adjacent and parallel to the rear wall 52 of base member 14 and is provided to accept the cammed actuator 120. The cam journal 94 has an open end 96 extending through the side wall 56 of the base member 14, and a closed end 98 disposed in the side wall 54. Spaced apart forward forcing cam block cavities 100 and 102 are disposed adjacent to the forward edge of the cam journal 94 and are separated by the dividing plateau 104. The forward forcing block cavities 100 and 102 are provided to respectively receive the forward forcing blocks 45 and 65 extending downward from the lid member 12. Spaced apart rearward forcing block cavities 106 and 108 are disposed adjacent the rearward edge of the cam journal 94 and are extended through the rear wall 52 of the base member 14. The rearward forcing block cavities 106 and 108 are provided to respectively receive the rearward forcing blocks 46 and 68 extending downwardly from the lid member 12.

Figure 4:
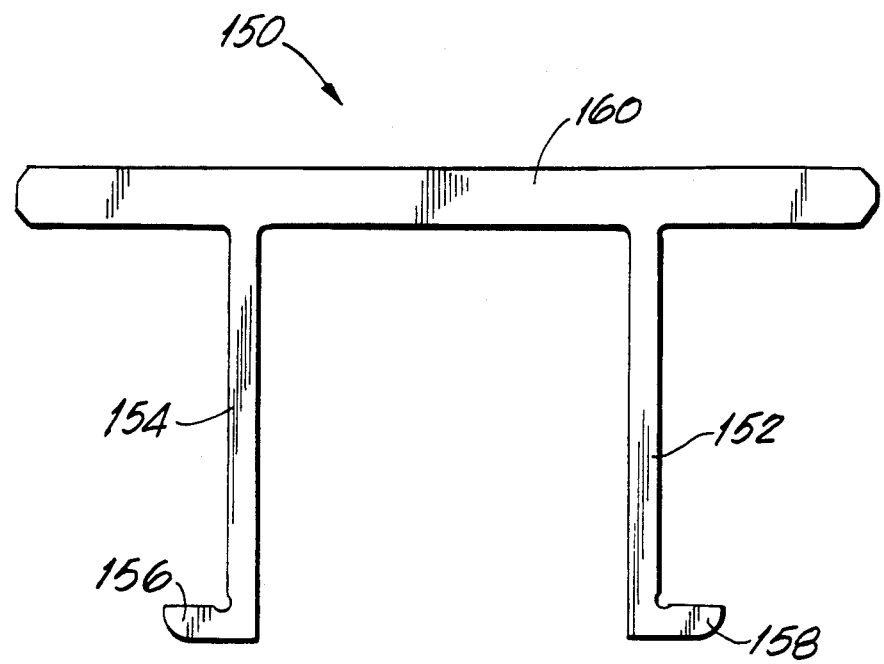
FIG. 4 is front elevational view of the flexible linking clip forming a portion of the subject invention.

Turning to FIG. 4, the socket 10 further includes a plurality of modified π-shaped flexible linking clips generally designated by reference numeral 150. The flexible linking clips 150 are provided to connect the lid member 12 to the base member 14 and to guide the lid member 12 upon the base member 14 during opening and closing operations. The flexible linking clips 150 are made from a metallic alloy in an etching process. Each flexible linking clip 150 comprises a pair of resilient parallel legs 152 and 154 attached at one end by a bridge 160. The resilient legs 152 and 154 include outwardly extending engaging feet 158 and 156 disposed on the distal ends thereof respectively. The clips are intended to be inserted, perpendicular to the plane of the socket 10, into the clip receiving slots 32, 34, 36, and 38 in the lid member 12. Thereafter, the resilient legs 152 and 154 are intended to extend into the clip locking slots 80, 82, 84 and 86 in the base member 14 such that the outwardly extending engaging feet become locked therein.

Figure 5:
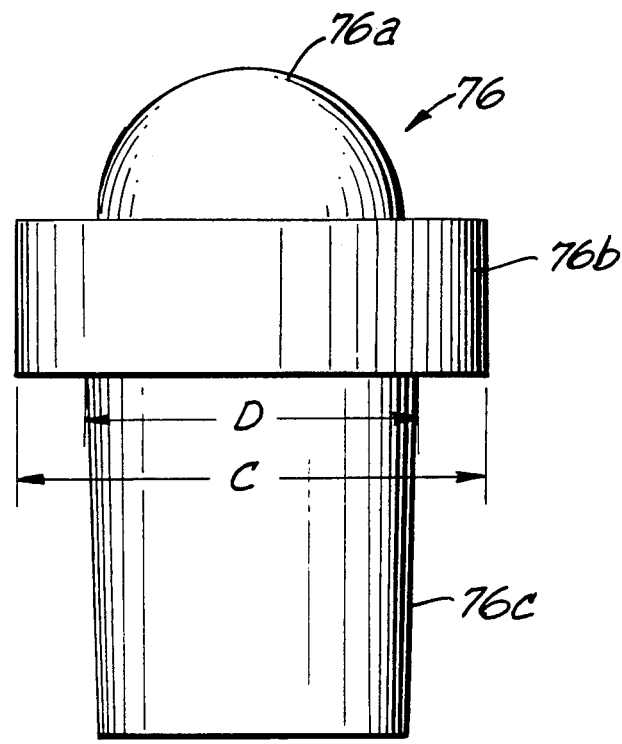
FIG. 5 is front elevational view of the spring loaded detent plunger forming a portion of the subject invention.

Turning to FIG. 5. the socket 10 of the subject invention further comprises a cylindrical detent plunger designated generally by reference numeral 76. The plunger 76 is intended to exert an upwardly applied force upon the unexposed surface of the lid member 12. The force is supplied by a coiled spring 74 of a desired force constant. The plunger 76 comprises a hemispherical detent 76a extending upwardly therefrom to make contact with the unexposed surface of the lid member 12. A cylindrical collar 76b is disposed intermediate the plunger 76 and has a diameter "C" that is larger than the outer diameter of the coiled spring 74 such that the coiled spring 74 exerts an upwardly applied force upon the collar 76b. The plunger 76 further comprises a cylindrical shaft 76c having a diameter "D" that is less than the inner diameter of the coiled spring 74 such that the cylindrical shaft 76c may be extended into the coiled spring 74. The plunger 76 and the coiled spring 74 are disposed in a cavity 78 at the center of the rear wall 52 of the base member 14, between the spaced apart rearward forcing block cavities 106 and 108.

Figure 6:
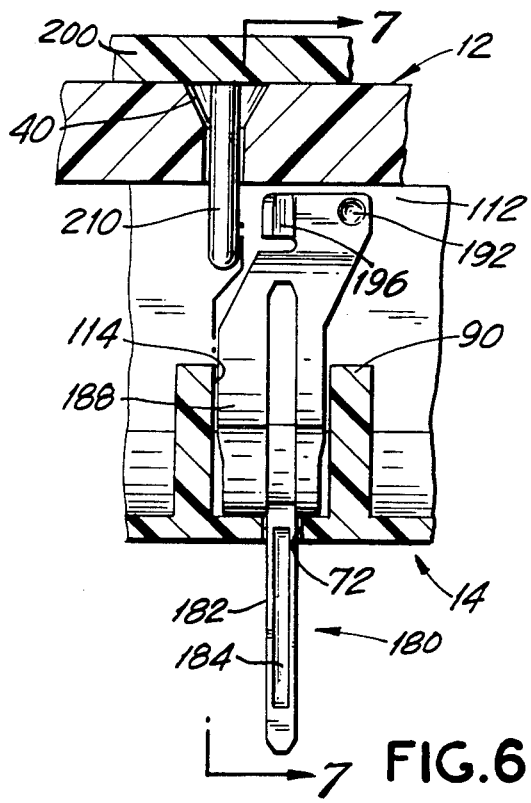
FIG. 6 is a side elevational view of the new and improved electrical connector of the subject invention prior to engagement with the conductive pin of an electrical component.
Figure 7:
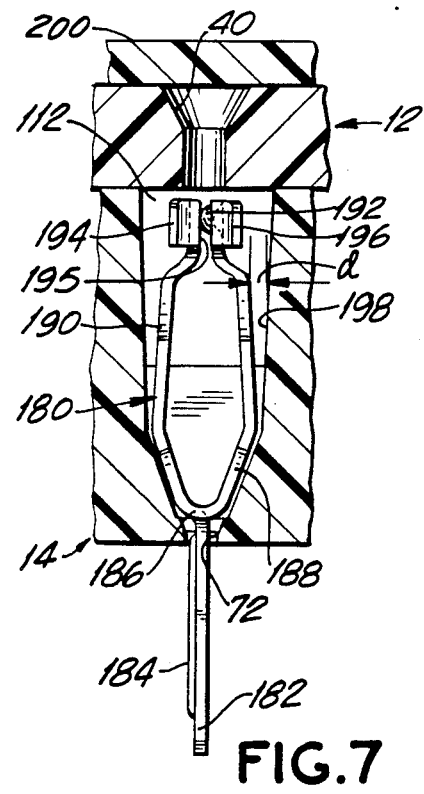
FIG. 7 is a cross-sectional view taken along line 7—7 in FIG. 6 and illustrating the electrical connector of the subject invention.

Turning to FIGS. 6 and 7, the electrical connectors of the subject invention are designated generally by reference numeral 180. An electrical connector 180 is unitarily formed from a metallic alloy in a stamping process. The electrical connector 180 comprises first and second opposed contact beams 188 and 190 joined at their lower ends by a base 186. First and second inwardly biased contact arms 194 and 196 are disposed on the upper distal ends of the first and second contact beams 188 and 190 respectively. Contact arm 196 on the first opposed contact beam 188 includes a hemi-spherical detent extending inwardly therefrom so as to make contact with the inner surface 195 of the second contact arm 194 on the distal end of the second opposed contact beam 190, thereby preloading the contact arms 194 and 196. By preloading the contact arms 194 and 196 the connector 180 does not rely upon the elongated spaced apart dividing walls 88 of the connector receiving ports 114 for a contact force. Instead the plurality of electrical connectors 180 float freely within a corresponding connector receiving port 114. A solder tail 182 is stamped out of and formed from the first opposed contact beam 188, and extends unitarily downward from the base 186. The solder tail 182 includes an elongated reinforcing embossment 184 extending outwardly therefrom. The width of the solder tail 182 is slightly less than the diameter of the circular aperture 72 disposed in the base member 14. Thus, upon extending the solder tail 182 through the circular aperture 72 the solder tail 182 will float freely therein.

When the socket 10 is assembled, the cammed actuator 120 is placed in the cam journal 94 such that the distal end 130 of the cammed portion 120 abuts the side wall 54 of the base member 14 at the closed end 98 thereof, and the handle portion 126 extends outwardly from the open end 96 of the cam journal 94. The spring 74 and the plunger 76 are inserted into the plunger cavity 78 disposed in the rear wall 52 of the base member 14.

An electrical connector 180 is inserted into each of the contact receiving ports 114 such that the solder tail 182 extends through the circular apertures 72 and beyond the bottom surface of the base member 14. Once inserted, each of the electrical connectors 180 floats freely within its respective contact receiving port 115 such that there is a gap 198 having a dimension "d" (see FIG. 7) between each of the contact beams 188 and 190 and the elongated spaced apart dividing walls 88 respectively.

Returning back to FIG. 2, the lid member 12 is placed atop the base member 14 such that the clip locking slots 82 and 84 disposed in side wall 54 of the base member 14 are in register with the clip receiving slots 32 and 34 disposed in the lateral edge 20 of the lid member 12 respectively. Further the clip locking slots 84 and 86 disposed in the side wall 56 of the base member 14 are in register with the clip receiving slots 36 and 38 disposed in the lateral edge 22 of the lid member 12 respectively.

Thereafter, a flexible linking clip 150 is inserted into each of the clip receiving slots 32, 34, 36 and 38 in the lid member 12 such that the bridge 160 of each of the flexible linking clips 150 sits in the oval clip bridge seats 24, 26, 28 and 30 respectively. The resilient parallel legs 152 and 154 of each of the flexible linking clips 150 are compressed together such that they may be extended through the clip receiving slots 32, 34, 36 and 38 and into the clipped locking slots 80, 82, 84 and 86 in the base member 14 respectively. At such a time the resilient legs 152 and 154 spring back to the neutral parallel condition such that the outwardly extending feet 156 and 158 respectively thereon, are engaged and locked in the base member 14.

In operation the lid member 12 translates longitudinally on the base member 14 upon lifting of the handle portion 126 of the cammed actuator 120 into an upwardly extended position as illustrated in FIG. 2. The cammed actuator 120 is kept in this upright position by the force exerted upon the unexposed surface of the lid member 12 by the spring loaded plunger 76 disposed in the rear wall 52 of the base member 14.

At that time, turning again to FIG. 6, the conductive pins 210 of an electrical component 200 may be inserted into the conical pin receiving apertures 40 disposed in the lid member 12 such that the contact pins 21 extend into the elongated parallel channels 112 disposed in the base member 14. Accordingly, there is no resistance or interference experienced by an operator when inserting the conductive pins 210 of an electrical component 200 through the pin receiving apertures 40 and into the elongated channels 112 (i.e. zero insertion force).

Figure 8:
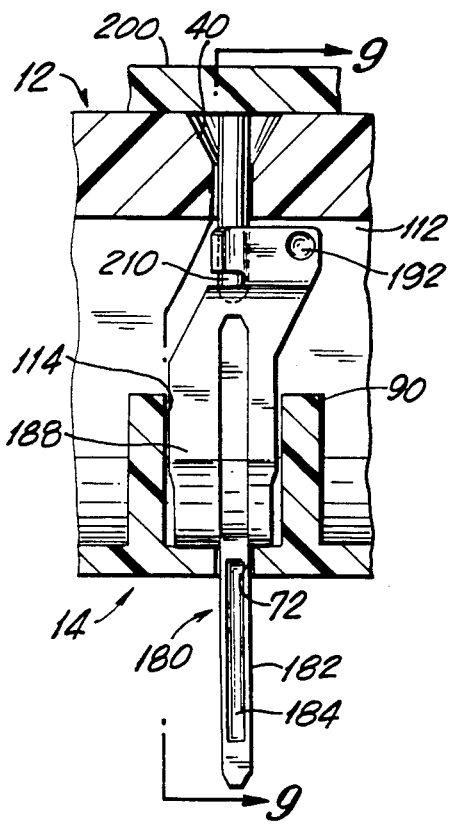
FIG. 8 is a side elevational view of the new and improved electrical connector fully engaged with the conductive pin of an electrical component.
Figure 9:
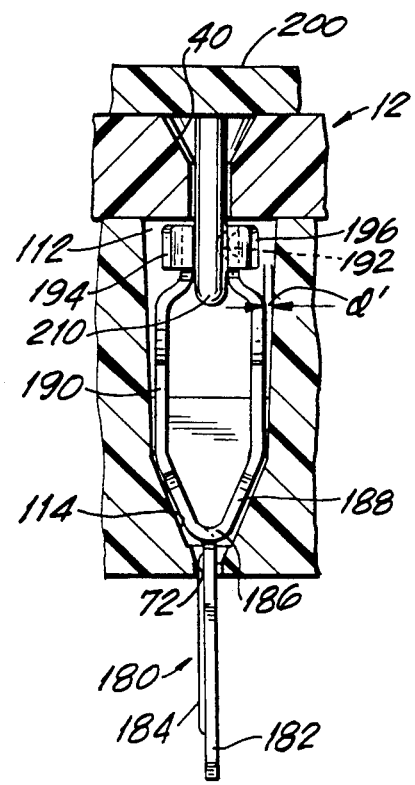
FIG. 9 is a cross-sectional view taken along line 9—9 in FIG. 8 and illustrating the electrical connector of the subject invention.

Turning now to FIGS. 8 and 9 while referring back to FIG. 2, to achieve electrical connection between the pins 210 of the component 200 and the plurality of electrical connectors 180 the lid member 12 must be translated longitudinally in the direction of arrow "X" (see FIG. 2). To do so, the handle portion 126 of the cammed actuator 120 is rotated downward with a low force such that the forward oriented first and second cams 132 and 136 rotate. Upon rotating the first and second cams 132 and 136 exert a longitudinal force against the forward forcing cam blocks 45 and 65 disposed on the unexposed surface of lid member 12 respectively. Thereafter, the forward forcing cam blocks 45 and 65 enter into the forward forcing block cavities 100 and 102 disposed in the base member 14. The plurality of flexible linking clips 150 act to guide the lid member 12 on the base member 14 during this longitudinal translation.

As the lid member 12 slides longitudinally with respect to the base member 14 in the direction of arrow "X" (see FIG. 2) the plurality of conductive pins 210 depending from the electrical component 200 come into contact with the contact arms 194 and 196 disposed on the distal end of the contact beams 190 and 188 of the electrical connectors 180 respectively. Upon making contact with the contact arms 194 and 196 the conductive pin 210 forces the contact arms 194 and 196 to spread apart. At such a time the inwardly biased contact arms 194 and 196 exert a lateral contact force upon the conductive pins 210 of the electrical component 200. The lateral contact force is provided by the hemispherical dimple 192 that extends inwardly from the first contact arm 196 to make contact with the inner surface 195 of the second contact arm 194.

As a result of the spreading of the contact arms 194 and 196 the contact beams 190 and 188 spread outwardly as well thereby diminishing the gap 198 between the contact beams 190 and 188 and the spaced apart elongated dividing walls 88 such that the width of the gap 198 becomes "d'" (see FIG. 9). The distance "d'" of the gap 198 after engagement of the conductive pin 210 and the electrical connector 180 is less than the distance "d" of the gap 198 prior to engagement of the conductive pin 210 and the electrical connector 180. However, the gap 198 is still wide enough to allow the electrical connectors 180 to float freely within a respective connector receiving port 114. At such time, electrical connection is established and test and evaluation may proceed.

Upon completing a test of electrical component 200 the cammed actuator handle 120 is again lifted into the upward position thereby causing the first and second cams 132 and 136 on the cammed portion 128 of the cammed actuator 120 to exert a force on the rearward forcing cam blocks 46 and 68 on the unexposed surface of the lid member 12 respectively. Thereafter, the rearward forcing blocks 46 and 68 enter into the rearward forcing block cavities 108 and 106 respectively such that the lid member 12 translates longitudinally with respect to the base member 14 in the direction of arrow "X'" (see FIG. 2). Simultaneously, the pins 210 of the electrical component 200 are disengaged from the electrical connectors 180 whereby the resilient contact beams 188 and 190 return to their neutral inwardly biased position due to do the inwardly extending hemispherical dimple 192 which preloads the contact beams 188 and 190.

Should the situation arise in which one of the electrical connectors 180 becomes broken or damaged, the bridges 160 of the plurality inexpensive flexible linking clips 150 can be severed with a pair of dikes and removed such that the lid member 12 may be lifted off of the base member 14. Thereafter, the damaged or broken electrical connector 180 can be readily removed and replaced. Subsequently, a new set of flexible linking clips 150 may be reinserted into the clip receiving slots and the lid member 12 may be once again connected to the base member 14.

In summary, there is provided a new and improved zero insertion force pin grid array test socket having a base member and a lid member that translates longitudinally upon the base member. A plurality of new and improved flexible linking and guidance clips are included which are inserted perpendicular to the plane of the socket. The socket further provides for a new and improved electrical connector having a pair of inwardly biased contact beams which are preloaded so that they do not rely upon the body of the socket for contact force.

While the invention has been described with respect to a preferred embodiment, it is apparent that various changes can be made without departing from the scope of the invention. For example, the handle of the cammed actuator can extend outwardly from either side of the pin grid array test socket and thus the structure associated with it can be provided on either side. Further, the mounting flanges extending outwardly from the front and rear edges of the base member may be unnecessary in some applications and therefore, may not be provided.

We claim:

1. An electrical socket for making solderless connections between conductive pins of an electrical component and a printed circuit board, said electrical socket comprising:

a substantially rectangular dielectric lid member having a plurality of pin receiving apertures disposed in a grid array, and a plurality of clip receiving slots therein;

a substantially rectangular dielectric base member having a plurality of connector receiving ports disposed in a grid array corresponding to said plurality of pin receiving apertures in said lid member, and a plurality of clip locking slots corresponding to said clip receiving slots in said lid member;

a plurality of modified π-shaped flexible clips, each clip having a pair of parallel legs connected at one end by a bridge, said parallel legs being inwardly flexible such that each clip may be extended through one of said clip receiving slots in said lid member and thereafter said legs resiliently returning to a parallel condition so as to be engaged in the corresponding clip locking slot in said base member so as to connect said lid member to said base member in a manner to allow longitudinal translation of said lid member upon said base member, said clips being removable from said lid member and said base member;

a plurality of electrical connectors disposed in said receiving ports in said base member and extending through said base member for connection to said printed circuit board; and actuation means for moving said lid member relative to said base member whereby the conductive pins of said electrical component are urged into said electrical connectors so as to make electrical connection between the electrical component and said printed circuit board.

2. An electrical socket as in claim 1 wherein said plurality of clip receiving slots and said plurality of clip locking slots are disposed adjacent the opposed sides of said rectangular lid member and said rectangular base member respectively.

3. An electrical socket as in claim 1 wherein the resilient parallel legs of said clip each include an outwardly extending engaging foot disposed on the lower ends thereof.

4. An electrical socket as in claim 1 wherein said base member includes a cylindrical cavity adjacent an edge thereof wherein a coiled spring and a generally cylindrical plunger are disposed, said plunger being provided to exert an upward force upon said lid member so as to maintain said actuation means in a desired position.

5. An electrical socket as in claim 1 wherein said actuation means includes a handle portion and a cammed portion, said cammed portion having first and second spaced apart cams.

6. An electrical socket for making solderless connections between conductive pins of an electrical component and a printed circuit board, said electrical socket comprising:

a substantially rectangular dielectric lid member having a plurality of pin receiving apertures disposed in a grid array, and a plurality of clip receiving slots therein;

a substantially rectangular dielectric base member having a plurality of connector receiving ports disposed in a grid array corresponding to said plurality of pin receiving apertures in said lid member, and a plurality of clip locking slots corresponding to said clip receiving slots in said lid member;

a plurality of modified $\pi$-shaped flexible clips, each clip having a pair of parallel legs connected at one end by a bridge, said parallel legs being inwardly flexible such that each clip may be extended through one of said clip receiving slots in said lid member and thereafter said legs resiliently returning to a parallel condition so as to be engaged in said corresponding clip locking slot in said base member so as to connect said lid member to said base member in a manner to allow longitudinal translation of said lid member upon said base member, said clips being removable from said lid member and said base member;

a plurality of electrical connectors disposed in said receiving ports in said base member and extending through said base member for connection to said printed circuit board, said electrical connector comprising a contact portion and an elongated lead portion, said contact portion including first and second opposed resilient contact beams connected at their lower ends by a bight, said first opposed beam having an elongated opening therein, material from said elongated opening being said elongated lead portion, said elongated lead portion extending from said bight in a direction opposite said contact portion, said first and second opposed contact beams being inwardly biased, said first opposed contact beam including a hemispherical dimple extending inwardly therefrom so as to make contact with said second beam and maintain said first and second inwardly biased beams in a spaced apart relationship, said elongated lead portion including an elongated reinforcing embossment extending outwardly therefrom; and actuation means for moving said lid member relative to said base member whereby the conductive pins of said electrical component are urged into said electrical connectors so as to make electrical connection between the electrical component and said printed circuit board.

7. An electrical socket as in claim 6 wherein said plurality of clip receiving slots and said plurality of clip locking slots are disposed adjacent the opposed sides of said rectangular lid member and said rectangular base member respectively.

8. An electrical socket as in claim 7 wherein the resilient parallel legs of said clip each include an outwardly extending engaging foot disposed on the lower ends thereof.

9. An electrical socket as in claim 7 wherein said base member includes a cylindrical cavity adjacent an edge thereof wherein a coiled spring and a generally cylindrical plunger are disposed, said plunger being provided to exert an upward force upon said lid member so as to maintain said actuation means in a desired position.

* * * * *